United States Patent
Dai et al.

(10) Patent No.: US 11,252,346 B1
(45) Date of Patent: Feb. 15, 2022

(54) SWITCHING TECHNIQUES FOR FAST VOLTAGE SETTLING IN IMAGE SENSORS

(71) Applicant: OMNIVISION TECHNOLOGIES, INC., Santa Clara, CA (US)

(72) Inventors: Tiejun Dai, Santa Clara, CA (US); Zhe Gao, San Jose, CA (US); Ling Fu, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 17/037,282

(22) Filed: Sep. 29, 2020

(51) Int. Cl.
*H04N 5/341* (2011.01)
*H04N 5/369* (2011.01)
*H01L 27/146* (2006.01)
*H04N 5/378* (2011.01)

(52) U.S. Cl.
CPC ....... *H04N 5/341* (2013.01); *H01L 27/14612* (2013.01); *H04N 5/3698* (2013.01); *H04N 5/378* (2013.01)

(58) Field of Classification Search
CPC ...... H04N 5/341; H04N 5/3698; H04N 5/378; H01L 27/14612
See application file for complete search history.

(56) References Cited

U.S. PATENT DOCUMENTS

| | | | | |
|---|---|---|---|---|
| 8,599,292 B2 * | 12/2013 | Chou | ................... | H04N 5/3577 348/294 |
| 10,116,925 B1 * | 10/2018 | Wang | ....................... | G01S 17/10 |
| 2018/0217261 A1 * | 8/2018 | Wang | ................... | H04N 13/204 |
| 2019/0174120 A1 * | 6/2019 | Wang | ................... | H04N 5/3696 |
| 2019/0192854 A1 * | 6/2019 | Hsu | ...................... | A61N 1/0543 |

OTHER PUBLICATIONS

"OmniVision Expands Industry's Smallest BSI Global Shutter Pixel Family With New VGA Image Sensor and Wafer-Level Camera Module," OmniVision®, Jan. 3, 2020 <https://www.ovt.com/news-events/product-releases/omnivision-expands-industrys-smallest-bsi-global-shutter-pixel-family-with-new-vga-image-sensor-and-wafer-level-camera-module> [Retrieved Sep. 28, 2020], 2 pages.

* cited by examiner

*Primary Examiner* — Shahbaz Nazrul
(74) *Attorney, Agent, or Firm* — Christensen O'Connor Johnson Kindness PLLC

(57) ABSTRACT

Switching techniques for fast voltage settling in image sensors are described. In one embodiment, a transfer gate (TX) driver circuit of an image sensor includes a TX driver configured to provide a TX driver voltage to a plurality of pixels of an image sensor. A power supply (NVDD) is operationally coupled to the TX driver. A first switch (SW1) operationally coupling an outside capacitance (Cext) and the TX driver. A second switch (SW2) operationally coupling the Cext and the NVDD. A third switch (SW3) operationally coupling the NVDD and the TX driver. A falling edge of the TX driver voltage is configured to control a start of data transfer from individual pixels of the plurality of pixels. The SW1 and the SW2 are configured in an open position before the falling edge of the TX driver voltage. The SW3 is configured in a closed position before the falling edge.

20 Claims, 7 Drawing Sheets

SWITCHING TECHNIQUES FOR FAST VOLTAGE SETTLING IN IMAGE SENSORS

BACKGROUND INFORMATION

Field of Disclosure

This disclosure relates generally to image sensors, and in particular to voltage settling and noise control during data transmission in CMOS image sensors.

BACKGROUND

Image sensors have become ubiquitous. They are widely used in digital still cameras, cellular phones, and security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

Generally, a higher sensor resolution necessitates a faster pixel readout to maintain a same frame ratio by increasing a frequency of pixel readout. However, increased frequency of the pixel readout leads to increased signal noise. Therefore, systems and methods are needed for reduced signal noise.

BACKGROUND INFORMATION

Field of Disclosure

This disclosure relates generally to image sensors, and in particular to voltage settling and noise control during data transmission in CMOS image sensors.

Background

Image sensors have become ubiquitous. They are widely used in digital still cameras, cellular phones, and security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

Generally, a higher sensor resolution necessitates a faster pixel readout to maintain a same frame ratio by increasing a frequency of pixel readout. However, increased frequency of the pixel readout leads to increased signal noise. Therefore, systems and methods are needed for reduced signal noise.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
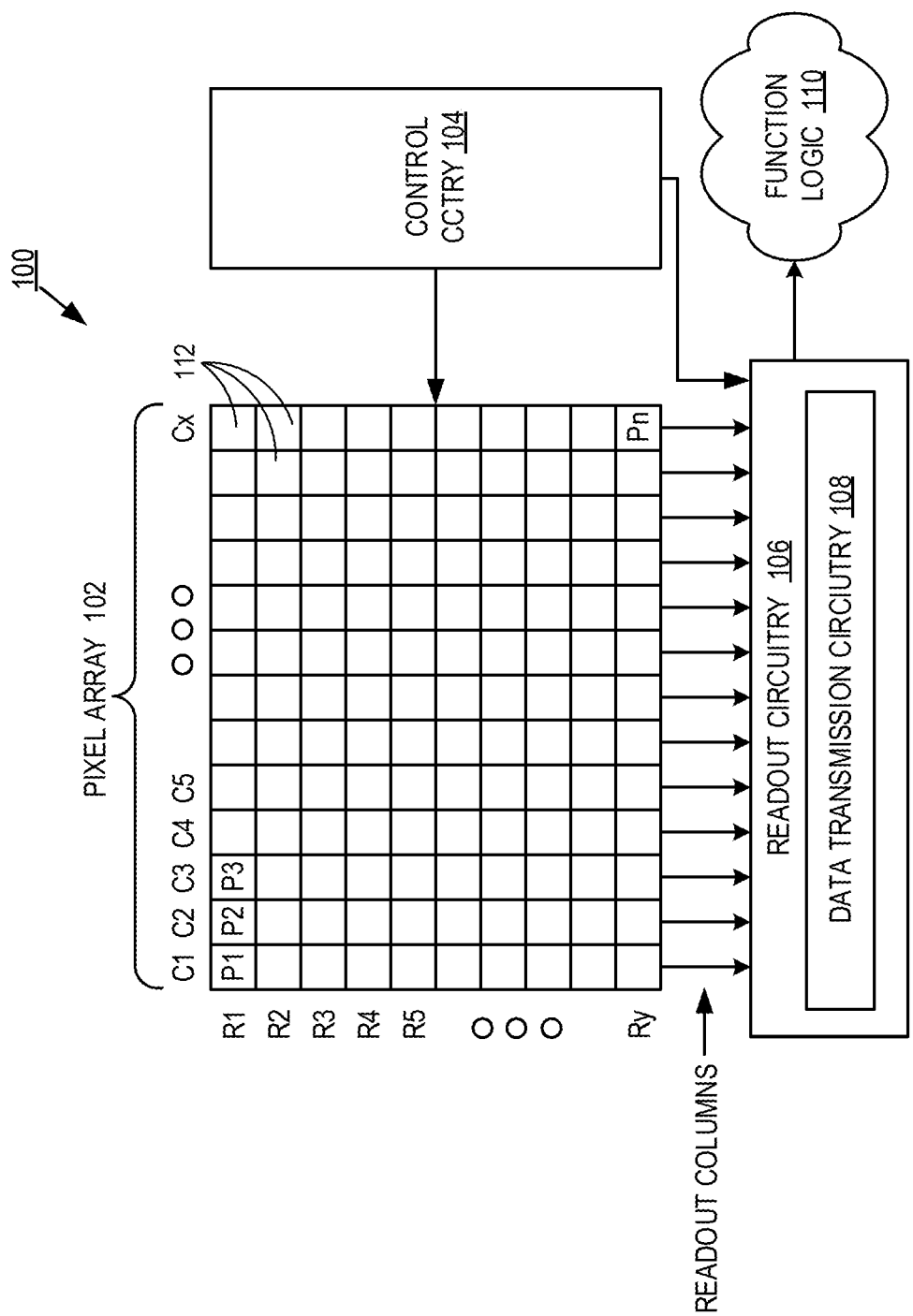
FIG. 1 is an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors having reduced noise during data transmission, therefore resulting in faster settling of the image sensor's pixels, are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the teachings of the present technology are directed to reducing noise levels of a transfer gate (TX) driver output as image data are transferred through shift register structures. In some embodiments, the noise reduction is achievable at least in part by reducing the time needed for a voltage produced by the TX driver to settle.

In operation, a TX driver may be switched on and off by an input control signal (TX_IN) while being powered by a power supply. Such switching causes noise (e.g., voltage spikes) and/or time delays caused by the external capacitance (e.g., parasitic or design capacitances). To overcome these problems, in some embodiments of the present technology, the TX driver is powered through a set of switches that alternately close and open to isolate the external capacitances from the TX driver during some portions of the data transfer. For example, the external capacitance may be first disconnected from the TX driver by a switch. As a result, the initial voltage spike and settling time caused by the falling edge of the signal are reduced, therefore enabling a faster or less noisy data transfer. After the pixel readout is initialized by a falling edge of the TX output signal, the external capacitance may be again connected to an electrical path connecting the power supply with the TX driver.

In other embodiments, the output voltage of the TX driver may be controlled through several voltage steps. For example, the falling edge of a positive voltage output TX signal may be followed a ground voltage for a duration of time before driving the output TX voltage to its ultimate negative voltage. By arranging these voltage steps from a positive voltage to a negative voltage in a non-overlapping manner, the overall duration of the voltage settling time may be reduced, and the final value of the target TX output voltage may become more accurate.

FIG. 1 illustrates an example imaging system 100 in accordance with an embodiment of the present disclosure. The imaging system 100 includes pixel array 102, control circuitry 104, readout circuitry 106, and function logic 110. In one example, the pixel array 102 is a two-dimensional (2D) array of photodiodes, or image sensor pixels 112 (e.g., pixels P1, P2 . . . , Pn). As illustrated, the photodiodes are arranged into rows (e.g., rows R1 to Ry) and columns (e.g., column C1 to Cx). In operation, the photodiodes acquire image data of a person, place, object, etc., which can then be used to render a 2D image of the person, place, object, etc. However, the photodiodes do not have to be arranged into rows and columns and may take other configurations.

In an embodiment, after each pixel 112 in pixel array 102 has acquired its image data or image charge, the image data is read out by a readout circuitry 106 and then transferred to a function logic 110. In various embodiments, the readout circuitry 106 may include signal amplifiers, analog-to-digital (ADC) conversion circuitry, and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 112 and the readout of image data from the readout circuitry 106. The function logic 110 may be a digital processor, for example. In one embodiment, the readout circuitry 106 may readout a row of image data at a time along readout column lines (as illustrated) or may readout the image data using a variety of other techniques (not illustrated), such as a serial readout or a full parallel readout of all pixels simultaneously.

In one embodiment, the control circuitry 104 is coupled to the pixel array 102 to control operation of the plurality of photodiodes in the pixel array 102. For example, the control circuitry 104 may generate a shutter signal for controlling image acquisition. In one embodiment, the shutter signal is a global shutter signal for simultaneously enabling all pixels within pixel array 102 to simultaneously capture their respective image data during a single acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash.

In one embodiment, data transmission circuitry 108 may receive image data from analog-to-digital converters (ADCs), thus converting analog image data into digital representations of the same. The digital representation of the image data is provided to the function logic 110. In some embodiments, the data transmission circuitry 108 may receive the digital representations of the image data from the ADCs in parallel and provide the same to the function logic 110 in series.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
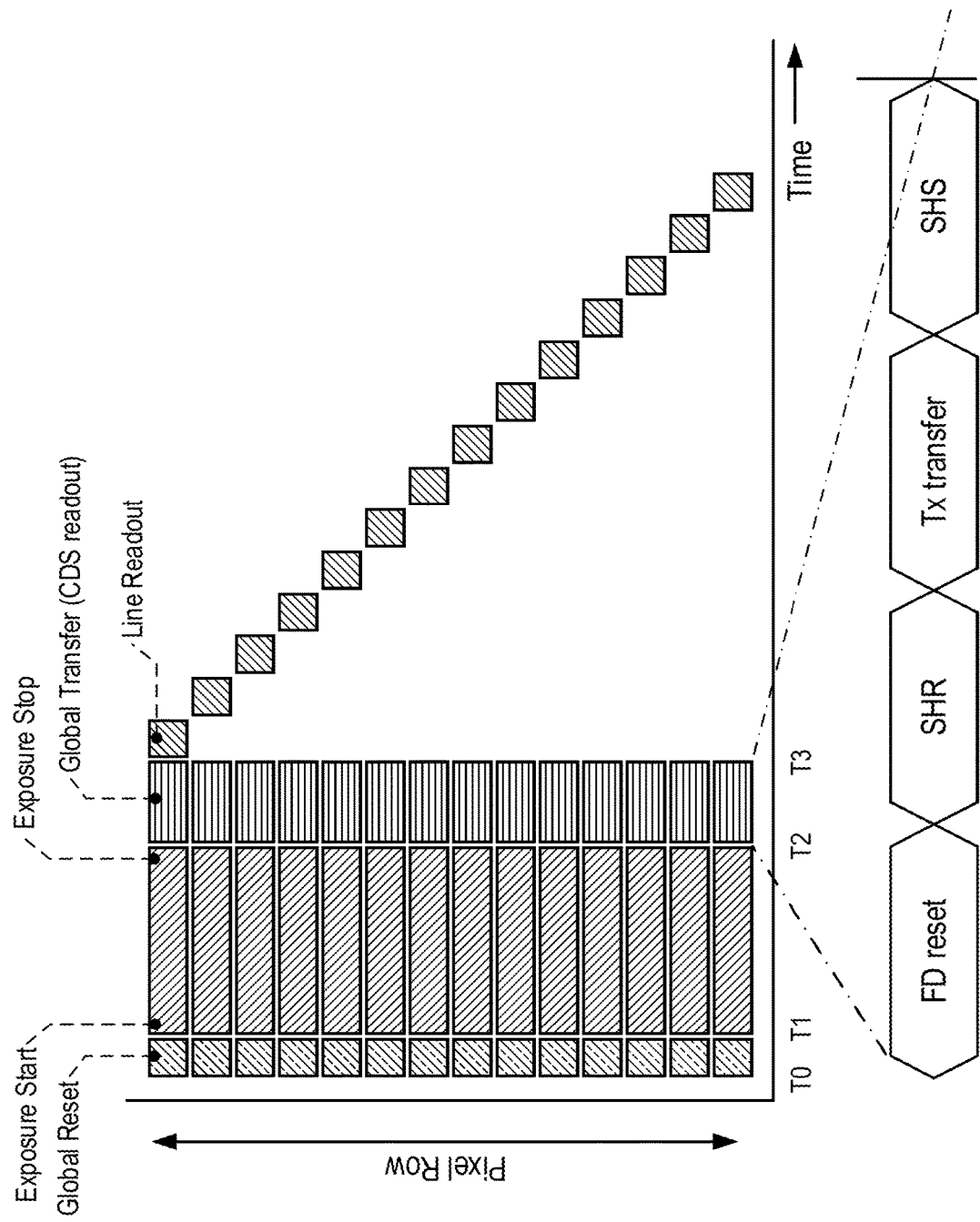
FIG. 2 is an example data transmission timing diagram in accordance with an embodiment of the present technology.

FIG. 2 an example timing diagram that illustrates the timing of line readouts of pixel rows in an image sensor in accordance with the teachings of the present invention, as included for instance in the imaging system 100 of FIG. 1. In the depicted example, the imaging system 100 is implemented with a global shutter design and correlated double sampling (CDS). As such, a global reset operation occurs at time T0. In one example, the global transfer operation begins with a floating diffusion reset (FD reset), after which time reset levels from the pixel array 102 may be sampled and held (SHR).

At time T1, an exposure or integration period begins and proceeds to time T2. Next, as shown in the depicted example, a global transfer operation or CDS readout operation occurs between time T2 and time T3. During the CDS readout, a transfer operation of signal levels may occur (TX transfer), after which the signal levels from the pixel array 102 may be sampled and held (SHS). With the reset levels and the signal levels from the pixel array 102, the CDS operation provides more accurate image data signals from the pixel array 102 (e.g., by subtracting the SHR values from the SHS values). After time T3, the line readout operations from the pixel array 102 may begin, row by row.

Figure 3:
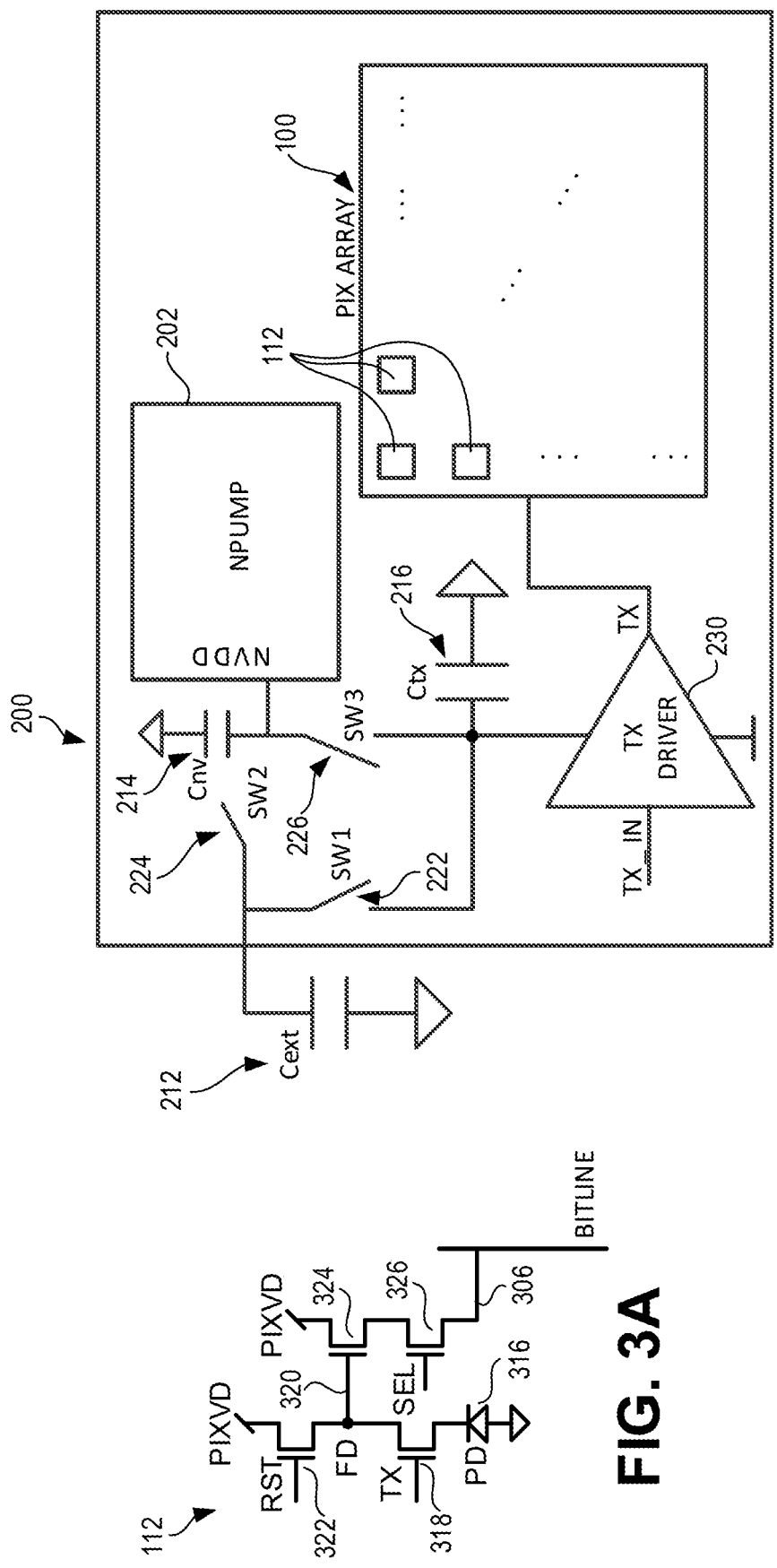
FIG. 3A is a circuit diagram of a sample pixel cell in accordance with an embodiment of the present technology.
FIG. 3B is a schematic diagram of a transfer gate (TX) driver in operation in accordance with an embodiment of the present technology.

FIG. 3A is a circuit diagram of a sample pixel 112 in accordance with an embodiment of the present technology. It is noted that a pixel level connection 306 output of the pixel cell 112 is further connected to a hold circuit (not shown) of a pixel of the image sensor. As shown in the depicted example, a pixel 112 includes a photodiode 316, which is coupled to photogenerate image charge in response to incident light. A transfer transistor 318 is coupled to transfer the photogenerated image charge from the photodiode 316 to a floating diffusion 320 in response to a transfer signal TX. A reset transistor 322 is coupled to a pixel voltage supply to reset the floating diffusion 320 in response to a reset signal RST. The gate of a source follower transistor 324 is coupled to convert the charge in the floating diffusion 320 to an image data signal, which is coupled to be output through a row select transistor 326 through pixel level connection 306 in response to a row select signal SEL. In an imaging system that utilizes CDS, the charge on the floating diffusion 320 is also read out through the pixel level connection 306 after a floating diffusion reset operation to obtain a reset level, and the charge on the floating diffusion 320 is also read out through the pixel level connection 306 after the image charge is transferred to the floating diffusion 320 to obtain a signal level.

FIG. 3B is a schematic diagram of a circuit 200 including a transfer gate (TX) driver in operation in accordance with an embodiment of the present technology. An output voltage TX of the TX driver 230 controls data transfer for a number of pixels 112 through additional circuitry that is discussed with reference to FIG. 3A above, and omitted from FIG. 3B for simplicity.

FIG. 3B shows a power supply (NVDD) 202 that can power the TX driver 230 through a combination of switches 222 (SW1), 224 (SW2) and 226 (SW3). The output signal TX of the TX driver 230 is controlled by an input signal TX_IN, which may be a digital signal. In operation, changes in the output signal TX determine data transfer from the pixels 112 of the pixel array 102. For example, a falling edge of the output signal TX may signify a beginning of data transfer from the pixels 112.

In some embodiments, circuit 200 includes capacitances that slow down switching of the TX driver 230 and/or create noise in the output signal TX (also referred to as a "driver voltage," "TX driver voltage" or "TX output voltage"). For example, a capacitance 212 (Cext) may be an outside capacitance that combines design or parasitic capacitances. A capacitance Cnv may be associated with an internal capacitance of the power supply NVDD, and a capacitance Ctx may be associated with the capacitance of the TX driver 230. In some embodiments, such capacitances at least in part result from the interactions between metal traces in the circuit. Generally, Cext tends to be relatively large in comparison to Cnv and Ctx. For example, in some embodiments Cext may range from 0.1 g to 4 µF, which is about 200 time larger (i.e., more than two orders of magnitude larger) than a typical sum of Cnv and Ctx. As a result, Cext tends to slow down voltage switching of the TX output voltage. Therefore, in some embodiments, the timing and accuracy of the falling edge of the TX output voltage is controlled by an ordered on/off switching of the switches SW1, SW2 and SW3. A sample timing diagram of such ordered switching is described with reference to FIG. 4 below.

Figure 4:
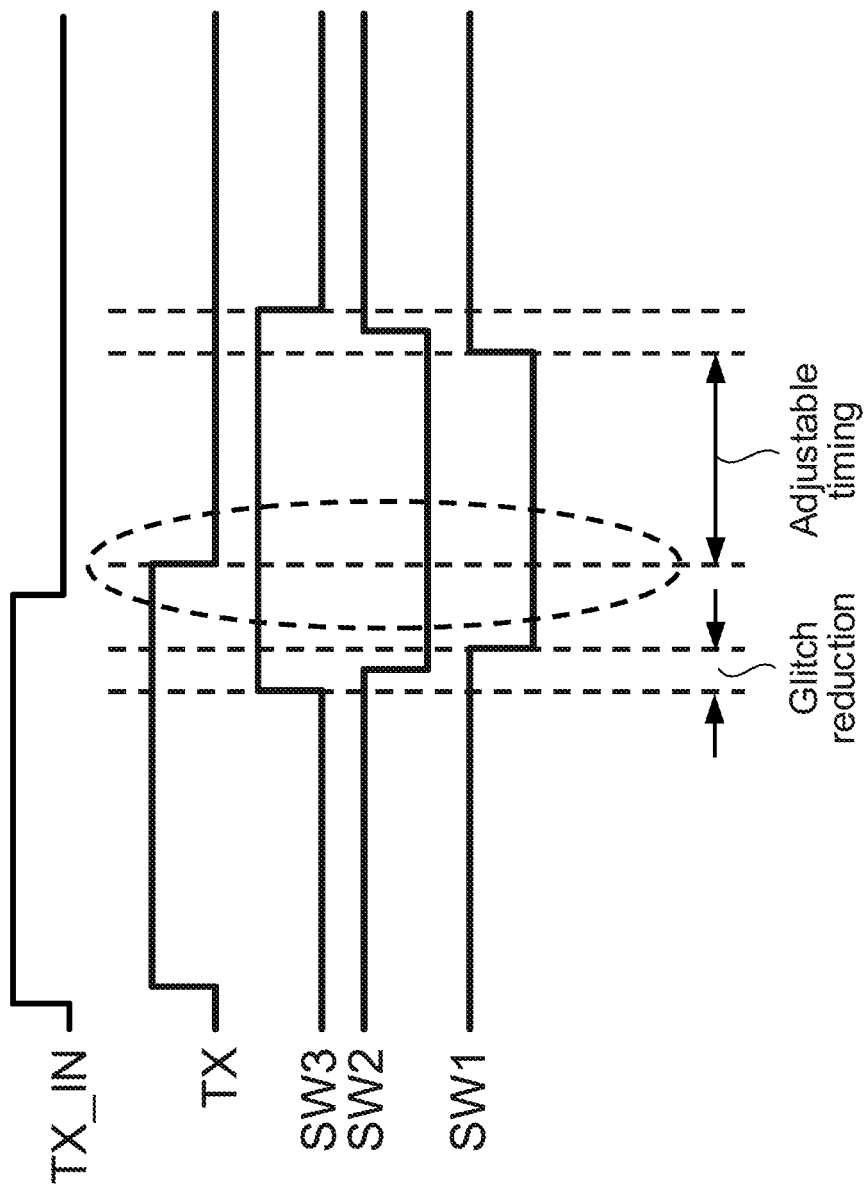
FIG. 4 is an example data transmission timing diagram in accordance with an embodiment of the present technology.

FIG. 4 is an example data transmission timing diagram in accordance with an embodiment of the present technology. In many embodiments, the falling edge of the TX output voltage controls a start of data transfer from individual pixels 112 of the pixel array 102. Before the falling edge of the TX output voltage, switches SW1 and SW2 may remain closed, while the switch SW3 is changed from an open to a closed position. Closing the switch SW3 establishes a separate voltage path from the power supply NVDD to the TX driver 230. Next, the switches SW1 and SW2 may be opened, while the power supply NVDD still supplies voltage to the TX driver 230. These events are collectively termed "glitch reduction" in the timing diagram. Next, the Cext may be reconnected to the NVDD 202 and TX driver 230 by closing the switches SW1 and SW2.

As described above, capacitances Cnv and Ctx are relatively small in comparison to the capacitance Cext. Therefore, once a relatively large Cext is disconnected from the TX driver 230 by the switches SW1 and SW2, the settling time associated with the falling edge of the TX output voltage may be reduced during the glitch reduction period. Furthermore, in some embodiments, the TX output voltage may settle to within +/−10 mV within relatively short "adjustable timing" period (e.g., 5 µs or 50 µs). Next, after the adjustable timing period assures that the TX output voltage is settled within a predetermined range, the switches SW1 and SW2 may be sequentially closed, while the switch SW3 may be opened, keeping the TX driver 230 powered and keeping the TX output voltage negative as driven by the TX_IN input signal. The data transfer from the pixels 112 continues till the next rising edge of the TX output voltage.

Figure 5:
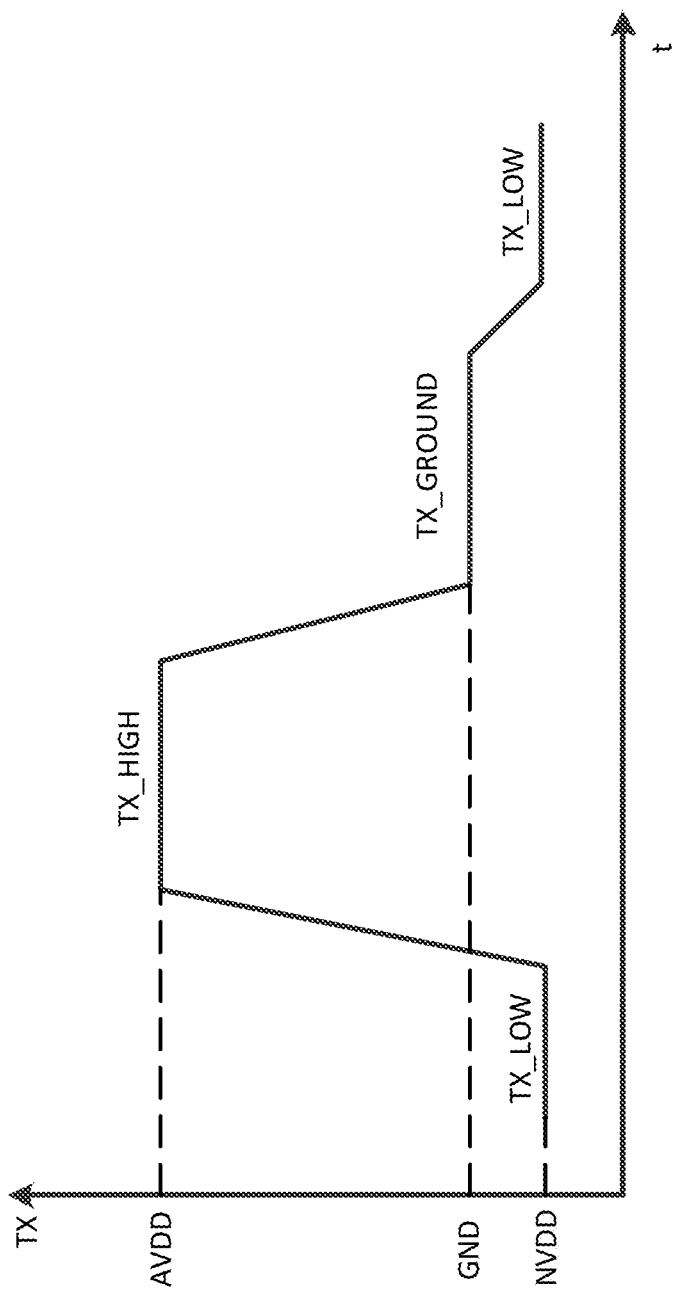
FIG. 5 is an example graph of TX voltages in accordance with an embodiment of the present technology.

FIG. 5 is an example graph of TX voltages in accordance with an embodiment of the present technology. An example implementation of such arrangement of the TX voltage is described in conjunction with a circuit of FIG. 6 and a timing diagram of FIG. 7. With the illustrated embodiment, a set of dedicated input signals are connected to the gates of corresponding transistors in a timed manner, therefore producing the resulting TX output voltages at three levels: AVDD (positive voltage), GND (ground) and NVDD (negative voltage). In at least some embodiments of the inventive technology, the intermediate GND voltage may reduce a disturbance (noise) experienced by the NVDD voltage. Furthermore, outputting the three TX output voltage levels in a non-overlapping manner also helps reducing the voltage noise and offset of the final level of NVDD.

Figure 6:
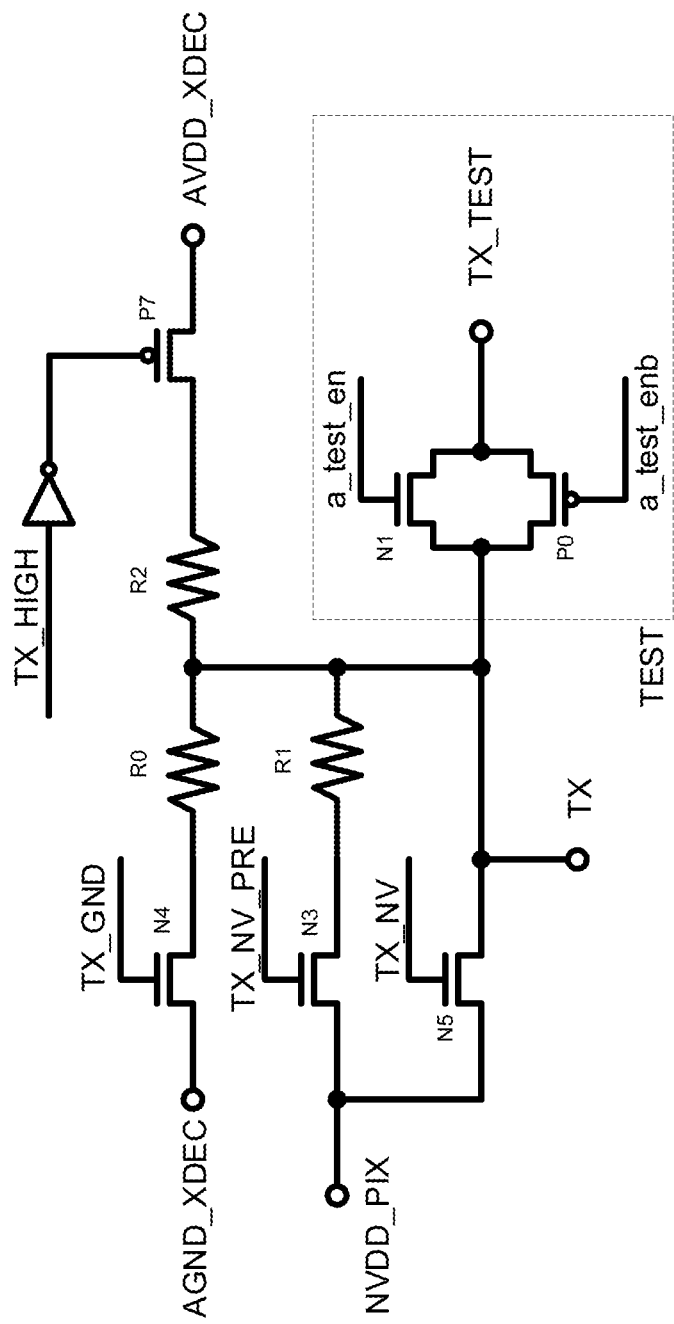
FIG. 6 is an example circuit diagram of a TX driver in accordance with an embodiment of the present technology.

FIG. 6 is an example circuit diagram 600 of a TX driver in accordance with an embodiment of the present technology. In operation, the gate control signals TX_HIGH, TX_GND, TX_NV_PRE and TX_NV are provided to the gates of their corresponding transistor in a time-offset manner described above. In some embodiments the initial TX_HIGH input signal may be connected to an input of an inverter (or other buffer), whose inverted output is provided to a gate of a PMOS (or other P-channel) transistor P7, which is coupled to provide the output TX_HIGH (or AVDD) voltage through resistor R2 to the TX output of circuit 600 as shown in FIG. 5. The TX_GND, TX_NV_PRE and TX_NV gate control signals may be connected to gates N4, N3 and N5 of NMOS (or other N-channel) transistors. When the TX_GND is set to High ("1"), the output voltage of the N4 transistor is GND (or AGND_XDEC in FIG. 6), which is provided through resistor R0 to the TX output of circuit 600; when TX_NV_PRE High, the output voltage of the N3 transistor is NVDD (or NVDD_PIX in FIG. 6), which is provided through resistor R1 to the TX output of circuit 600; and when TX_NV is High, the output voltage of the N5 transistor is NVDD, which is provided to the TX output of circuit 600. In different embodiments different resistance values for R0, R1, and R2 may be used. The outputs of these transistors of circuit 600 may be connected from the node TX to the corresponding pixel cell circuits, for example, the pixel cell circuits shown in FIG. 3A. Other pixel cell circuits are possible in other embodiments. In some embodiments, a node TX_TEST and its associated circuitry is used for testing the circuit 600.

Figure 7:
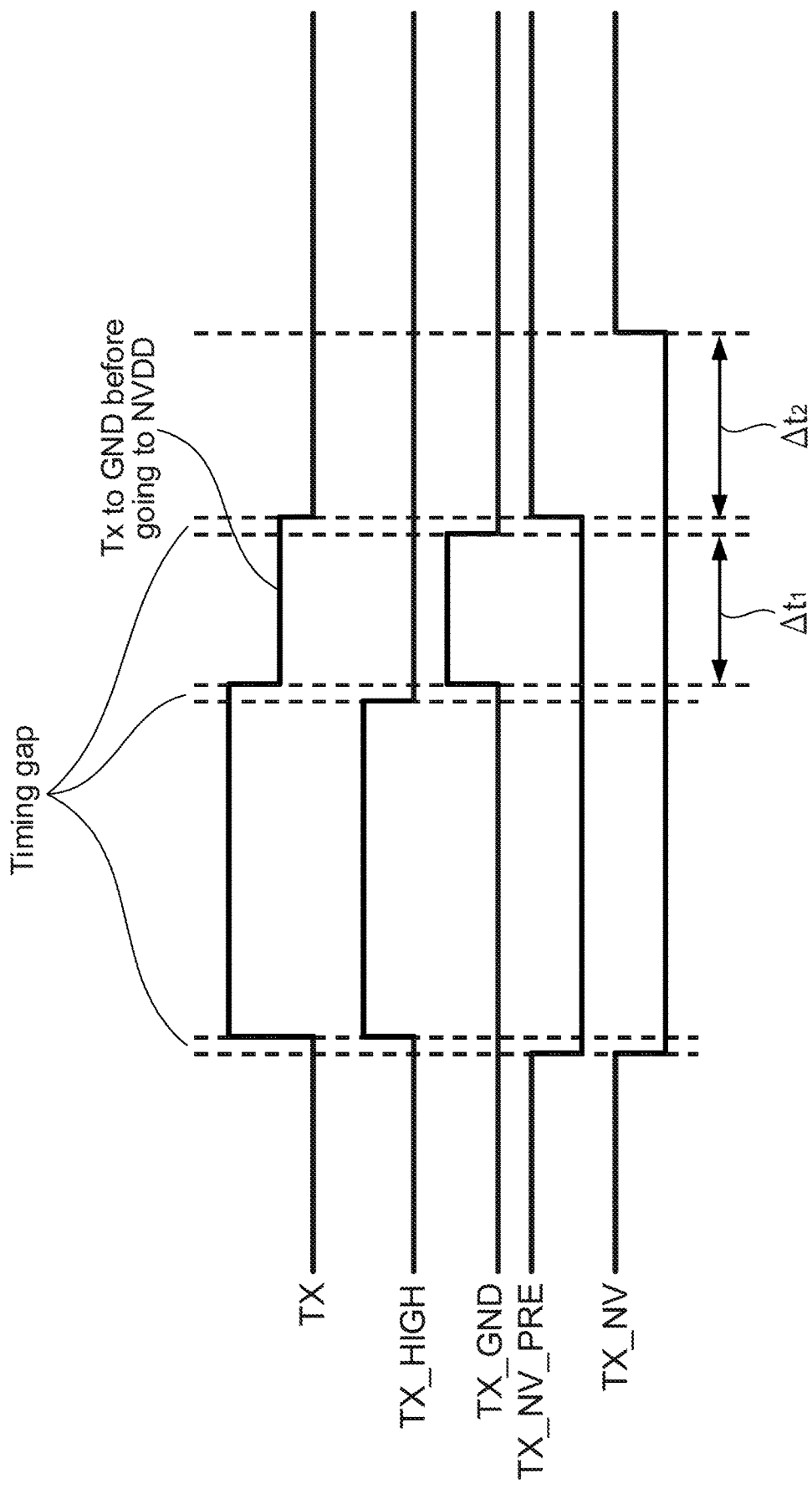
FIG. 7 is an example data transmission timing diagram in accordance with an embodiment of the present technology.

FIG. 7 is an example data transmission timing diagram in accordance with an embodiment of the present technology. This timing diagram may be used as the gate control signals TX_HIGH, TX_GND, TX_NV_PRE and TX_NV in the circuit 600. Collectively, these gate control signals result in the output driver voltage TX.

The process may start as shown in FIG. 6 with the TX output voltage initially at a value of NVDD and then the TX_HIGH gate control signal being set to High, while all other gate control signals are set to Low ("0"). In response, the TX output voltage transitions from NVDD to AVDD. Next, the TX_HIGH gate control signal is set to Low, while the TX_GND is set to High, resulting in the TX output voltage transitioning to GND (e.g., 0 V). As explained above, the intermediate GND voltage may reduce the noise in the TX output voltage as the TX output voltage progresses to its target value of NVDD at later time. In some embodiments, a duration of TX_GND (Δt1) may be only about 0.5-2 μs, while accounting for about 95% of the TX output voltage spike settling.

Next, the TX_GND gate control signal is set to Low, while the TX_NV_PRE is set to High, resulting in the TX output voltage transitioning to NVDD. In some embodiments, switching the TX output voltage is set to the NVDD value in two steps: setting the gate control signal TX_NV_PRE during a time period Δt2, followed by setting the gate control signal TX_NV. Both of these two gate control signals cause nominally the same output voltage NVDD. However, such two-step setting of the TX output voltage may further improve settling the noise of the TX output voltage. For example, the TX output voltage noise that remained after the TX_GND gate control signal being High may be further reduced by 70% during the TX_NV_PRE step, i.e., before the TX_NV being set to High.

The gate control signals TX_HIGH, TX_GND, TX_NV_PRE and TX_NV may be applied in a non-overlapping manner to reduce the noise. In some embodiments, the consecutive edges of the gate control signals may be separated by about 100 ns.

Many embodiments of the technology described above may take the form of a computer or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware or a combination of software and hardware.

The above description of illustrated examples of the invention, including what is described in the Abstract is not intended to be exhaustive or to limit the invention to the precise forms disclosed. As used herein, the term "about" indicates that the subject value can be modified by plus or minus 5% and still fall within the disclosed embodiment. While specific examples of the invention are described herein for illustrative purposes, various modifications are possible within the scope of the invention, as those skilled in the relevant art will recognize.

These modifications can be made to the invention in light of the above detailed description. The terms used in the following claims should not be constructed to limit the invention to the specific examples disclosed in the specification, Rather the scope of the invention is to be determined entirely by the following claims, which are to be construed in accordance with established doctrines of claim interpretation.

What is claimed is:

1. A transfer gate (TX) driver circuit of an image sensor, comprising:
   a TX driver configured to provide a TX driver voltage to a plurality of pixels of an image sensor;
   a power supply (NVDD) operationally coupled to the TX driver;
   a first switch (SW1) operationally coupling an outside capacitance (Cext) and the TX driver;
   a second switch (SW2) operationally coupling the Cext and the NVDD; and
   a third switch (SW3) operationally coupling the NVDD and the TX driver;
   wherein a falling edge of the TX driver voltage is configured to control a start of data transfer from individual pixels of the plurality of pixels;
   wherein the SW1 and the SW2 are configured in an open position before the falling edge of the TX driver voltage; and
   wherein the SW3 is configured in a closed position before the falling edge of the TX driver voltage.

2. The TX driver circuit of claim 1, wherein the Cext is at least two orders of magnitude larger than a sum of a TX driver capacitance (Ctx) and a power supply capacitance (Cnv).

3. The TX driver circuit of claim 2, wherein the Cext is about 200 times larger than the sum of the Ctx and the Cnv.

4. The TX driver circuit of claim 1, wherein the TX driver voltage settles to within +/−10 mV within less than 50 μs after the SW3 is configured in the closed position.

5. The TX driver circuit of claim 1, wherein, after the falling edge of the TX driver voltage and before a next raising edge of the TX driver voltage, the SW1 and the SW2 are configured in a closed position.

6. The TX driver circuit of claim 5, wherein, after the falling edge of the TX driver voltage and before the next raising edge of the TX driver voltage, and after the SW1 and SW2 are configured in the closed position, the SW3 is configured in an open position.

7. A method of operating a transfer gate (TX) driver circuit of an image sensor, comprising:
   configuring a first switch (SW1) in an open position before a falling edge of a TX driver voltage, wherein the SW1 operationally couples an outside capacitance (Cext) and a TX driver
   configuring a second switch (SW2) in an open position before the falling edge of the TX driver voltage, wherein the SW2 operationally couples the Cext and a power supply (NVDD); and
   configuring a third switch (SW3) in a closed position before the falling edge of the TX driver voltage, wherein the SW3 operationally couples the NVDD and the TX driver,
   wherein the TX driver is configured to provide the TX driver voltage to a plurality of pixels of the image sensor; and wherein the falling edge of the TX driver voltage is configured to control a start of data transfer from individual pixels of the plurality of pixels.

8. The method of claim 7, further comprising:
configuring the SW1 in a closed position after the falling edge of the TX driver voltage and before a next raising edge of the TX driver voltage; and
configuring the SW2 in a closed position after the falling edge of the TX driver voltage and before the next raising edge of the TX driver voltage.

9. The method of claim 7, further comprising:
configuring the SW3 in an open position after the falling edge of the TX driver voltage and before the next raising edge of the TX driver voltage.

10. The method of claim 7, wherein the TX driver voltage settles to within +/−10 mV between configuring the SW3 in the closed position and configuring the SW3 in the open position.

11. A transfer gate (TX) driver for providing a TX driver voltage to a plurality of pixels of an image sensor, the TX driver comprising:
a first transistor configured to output a positive voltage (TX_HIGH) during a first period of time;
a second transistor configured to output a ground voltage (TX_GND) during a second period of time after the first period of time;
a third transistor configured to output a negative voltage (TX_NV_PRE) during a third period of time; and
a fourth transistor configured to output a negative voltage (TX_NV) during a fourth period of time,
wherein outputs of the first, second, third and fourth transistors are coupled to a common point that is configured to control data transfer from individual pixels of the plurality of pixels.

12. The TX driver of claim 11, wherein the TX_NV_PRE and the TX_NV are the same.

13. The TX driver of claim 11, wherein:
the first period of time precedes the second period of time by a first timing gap;
the second period of time precedes the third period of time by a second timing gap; and
the third period of time precedes the fourth period of time by a timing gap.

14. The TX driver of claim 13, wherein the first timing gap, the second timing gap and the third timing gap are the same.

15. The TX driver of claim 14, wherein the first timing gap, the second timing gap and the third timing gap are about 100 ns long.

16. The TX driver of claim 11, further comprising a TX inverter coupled to a gate of the first transistor, wherein the TX inverter is configured to invert an input TX_HIGH signal.

17. The TX driver of claim 12, wherein the first transistor is a PMOS transistor.

18. The TX driver of claim 11, wherein the second transistor, the third transistor and the fourth transistor are NMOS transistors.

19. The TX driver of claim 11, wherein the second period of time is between 0.5 μs and 2 μs long, and the third time period is between 1 μs and 4 μs long.

20. The TX driver of claim 19, wherein a voltage at the common point settles to within +/−5% of its final value during the second period of time.

* * * * *